United States Patent [19]
Garcia

[11] Patent Number: 5,495,217
[45] Date of Patent: Feb. 27, 1996

[54] COMPACT HYBRID MICROWAVE CHOKE

[75] Inventor: Jose M. Garcia, North Bergen, N.J.

[73] Assignee: Philips Electronics North America Corporation, New York, N.Y.

[21] Appl. No.: 269,851

[22] Filed: Jun. 30, 1994

[51] Int. Cl.⁶ .................. H01P 1/20; H03H 7/01
[52] U.S. Cl. ........................... 333/246; 333/185
[58] Field of Search .................. 333/245, 246, 333/263, 185; 330/297

[56] References Cited

U.S. PATENT DOCUMENTS 3,869,678  3/1975  Mahoney ........................ 330/53
5,192,924  3/1993  Agahi-Kesheh et al. ........ 333/175

FOREIGN PATENT DOCUMENTS

| 141001 | 8/1983 | Japan | 333/246 |
| 245001 | 10/1988 | Japan | 333/245 |
| 279601 | 11/1988 | Japan | 333/245 |
| 4035202 | 2/1992 | Japan | 333/246 |
| 4140901 | 5/1992 | Japan | 333/263 |

*Primary Examiner*—Benny Lee
*Attorney, Agent, or Firm*—Robert J. Kraus

[57] ABSTRACT

A microwave choke is provided which includes a lumped-element capacitor, a lumped-element inductor and a transmission line.

8 Claims, 2 Drawing Sheets

COMPACT HYBRID MICROWAVE CHOKE

BACKGROUND OF THE INVENTION

1. Field of the Invention

This invention relates to a microwave choke and in particular to a hybrid choke including lumped and distributed elements.

2. Description of Related Art

A choke is often used when it is desired to isolate microwave-frequency energy from low-frequency energy. A typical example is the isolation of a power supply from microwave energy propagated in circuitry powered by the supply.

In some uses, such as in portable cellular telephones, it is important that a microwave choke be as compact as possible. A small-sized microwave choke can be made from lumped capacitive and inductive elements, but the inductive-element Q is generally too low for efficient operation. In other words, lumped elements with suitably high inductances for use in microwave chokes also generally have resistances which dissipate more power than is acceptable. This is especially a problem in portable microwave apparatus where such dissipation both reduces battery life and decreases the power output of the apparatus. In the example given, i.e. portable cellular telephones, the consequence of such unacceptable power dissipation is reduced talk time and transmission range.

Alternatively, a distributed inductive element, such as a quarter-wave transmission line, can be used in place of a lumped inductive element in a microwave choke. Especially at the low end of the microwave frequency band, however, a quarter-wave transmission line can be relatively large and occupy more space than is available. This is particularly true in certain portable apparatus, such as in portable cellular telephone apparatus operating in the frequency range of 800 to 2400 MHz.

SUMMARY OF THE INVENTION

It is an object of the invention to provide a compact microwave choke having a substantially higher Q than is obtainable from a lumped inductive element.

It is another object of the invention to provide a microwave amplifier circuit including a high-Q choke for efficiently supplying DC power to the circuit.

In accordance with the invention, a microwave choke is provided which includes the serially-connected combination of a lumped-element capacitor, a lumped-element inductor and a transmission line of predetermined length. Collectively, these elements provide a choke input impedance having a magnitude which is much larger than that of a predetermined characteristic impedance $Z_o$ of a circuit to which the choke is to be connected and which operates at a predetermined frequency $f_o$. At $f_o$:

a. the lumped-element capacitor has a reactance $X_C$ which is much smaller than the magnitude of the characteristic impedance $Z_o$;

b. the inductor has a resistance $R_L$ which is much smaller than the magnitude of the characteristic impedance $Z_o$ and has a reactance $X_L$ which is much larger than the resistance $R_L$ and which produces a phase shift $\Phi_L$ which is equivalent to a transmission line electrical length of $\lambda_L = N(\lambda_o/4)$, where N is less than 1 and where $\lambda_o$ is the wavelength of signals propagating at $f_o$; and c. the transmission line has an electrical length substantially equal to $\lambda_o/4 - \lambda_L$ and has a characteristic impedance with a magnitude that is not substantially different from that of $Z_o$.

As used herein, the term "much smaller than" means that, with respect to a particular function, such as impeding the transmission of electrical energy, a first magnitude is so small as to be insignificant as compared with a second magnitude. Typically, a first magnitude which is approximately 10% or less of a second magnitude is considered to be much smaller than the second magnitude.

The above-described choke has a substantially higher Q than one employing only a lumped-element inductor and has a substantially smaller size than a choke using a quarter-wave transmission line in place of a lumped element. Thus, it provides versatility in trading off the advantage of maximum Q against minimum size. Generally the Q of the choke increases with the electrical length, and thus the size, of the transmission line. For example, a choke in accordance with the invention can be designed to completely fill an available area on a circuit board, thereby efficiently utilizing board space while maximizing Q.

In a preferred embodiment of the invention, the choke is disposed on a dielectric substrate along with a circuit to which DC power is to be provided through the choke. The lumped-element capacitor includes a first terminal which is electrically connected to a ground plane, which is disposed on one side of the substrate, and includes a second terminal which is adapted for electrical connection to a DC power source. A first end of the serially-connected combination of the lumped-element inductor and the transmission line is electrically connected to the second terminal of the capacitor. A second end of this combination is electrically connected to the circuit.

DESCRIPTION OF THE PREFERRED EMBODIMENT

Figure 1A:
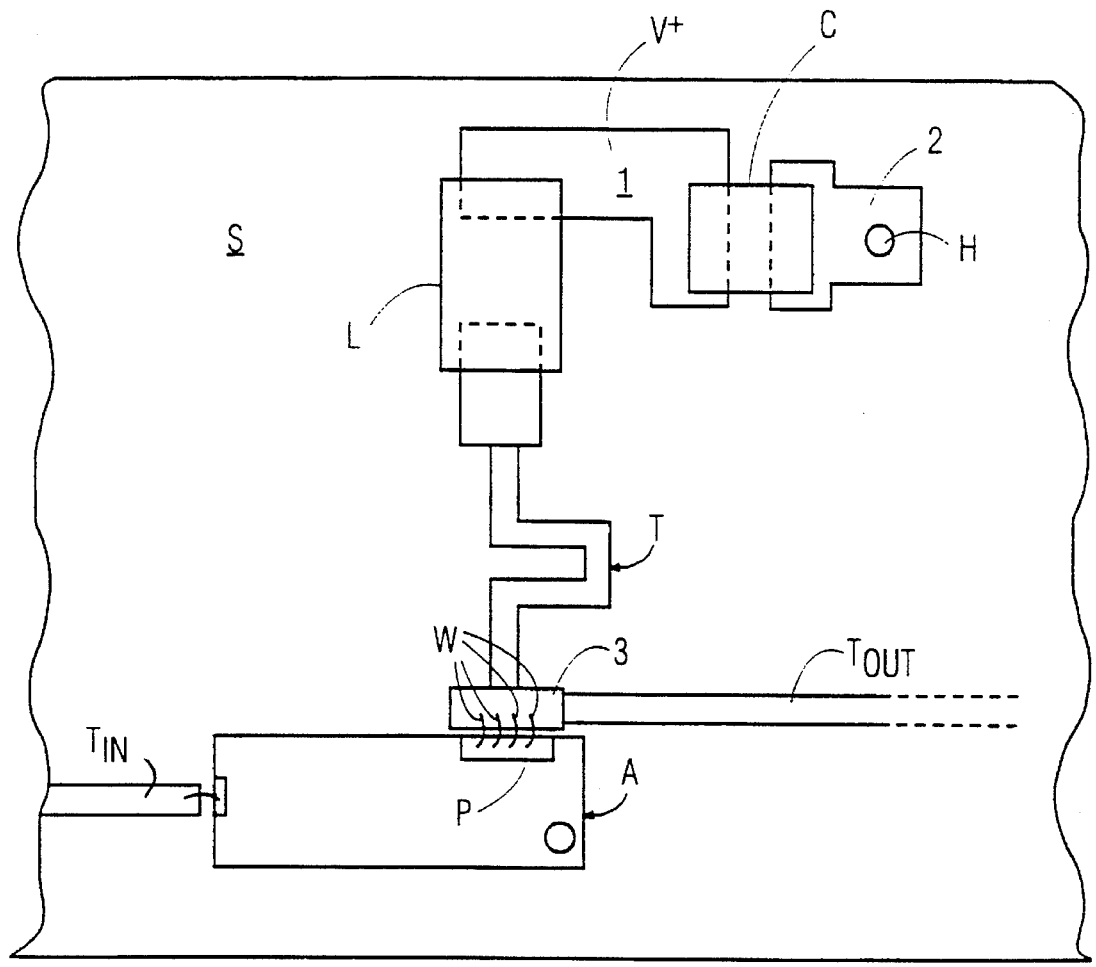
FIGS. 1a and 1b are physical and schematic illustrations, respectively, of a preferred embodiment of the invention.
Figure 1B:
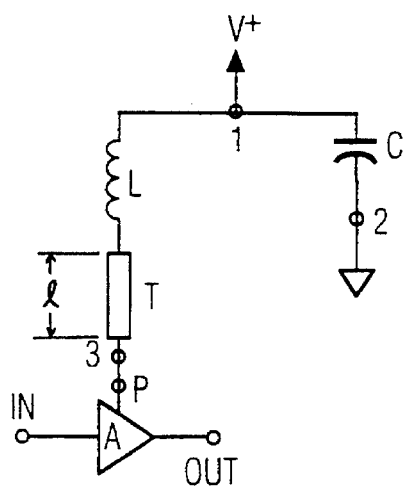

FIGS. 1a and 1b are a top view and a schematic illustration, respectively, of an exemplary microwave circuit in accordance with the invention. The circuit includes a microwave integrated-circuit amplifier A and a choke through which DC power is supplied to a power supply node P of the amplifier. The entire microwave circuit is supported on a dielectric substrate S (See FIG. 1a).

The choke includes the serially-connected combination of a lumped-element capacitor C, a lumped-element inductor L, and a microstrip transmission line T of predetermined lineal length l. The choke also includes a node 1 for connection to a source of DC power $V^+$, a node 2 which is electrically connected to a ground plane on an opposite side of the substrate (not shown), and a node 3 which is electrically connected to node P of the amplifier.

In the physical embodiment illustrated in FIG. 1a, the substrate comprises a thin dielectric material, such as alumina. On the top surface shown, the substrate supports the microwave amplifier A, the discrete components C and L, the transmission line T, and an arrangement of interconnecting conductive strips, pads, and wires.

Input node IN and output node OUT (See FIG. 1b.) of the microwave amplifier are electrically connected to respective transmission lines $T_{IN}$ and $T_{OUT}$ (See FIG. 1a.) for carrying microwave signals to and from the amplifier. Each of these transmission lines has a width/height ratio that determines its characteristic impedance.

The capacitor C is a chip capacitor having terminals at opposite ends which are electrically connected to conductive pads forming the nodes 1 and 2. The pad forming node 1 also serves as a means to which an electrical lead may be attached for connecting the circuit to a source of DC power, e.g. at a voltage $V^+$, for the amplifier. The pad forming node 2 is electrically connected by means of a conductive layer through a hole H (See FIG. 1a.) to the ground plane on the opposite side of the substrate S.

The inductor L is a chip inductor having terminals at opposite ends, with one terminal being electrically connected to the pad forming node 1 and the other terminal being electrically connected to one end of the transmission line T. The opposite end of this transmission line is electrically connected to a conductive pad forming node 3. Node 3 is electrically connected to node P of the amplifier by means of a wire W (See FIG. 1a). All of the electrical connections to the conductive pads forming the nodes may be made by processes such as soldering or applying conductive epoxy.

The microwave amplifier is selected, and the transmission lines $T_{IN}$ and $T_{OUT}$ are designed, to operate over a band of frequencies centered at a frequency $f_o$. The dimensions of the strip transmission lines $T_{IN}$ and $T_{OUT}$ are chosen, as is well known in the art, to produce a characteristic impedance $Z_o$ corresponding to the input and output impedances of the selected amplifier.

The principal function of the choke capacitor C is to bypass to ground any high frequencies from the amplifier which could damage the power source connected to node 1. This is achieved by selecting a capacitor which, at $f_o$, has a reactance $X_C$ that is much smaller than the input impedance of the power source, which is typically smaller than $Z_o$, thereby providing substantially a short circuit to ground for energy at the operating frequencies of the amplifier.

The inductor L and the transmission line T in the choke must collectively provide a high Q and a low-resistance path for the DC power flowing from the power source to the amplifier. Thus, the inductor should have a resistance $R_L$ which is much smaller than the characteristic impedance $Z_o$ and, at $f_o$, should have a reactance $X_L$ which is substantially larger than $R_L$. The reactance $X_L$ should also produce a phase shift $\Phi_L$ which, at $f_o$, is equivalent to a transmission line electrical length of $\lambda_L=N(\lambda_o/4)$, where N is less than 1 and where $\lambda_o$ is the wavelength of signals propagating at $f_o$. As N is increased, the physical length l required for the transmission line T decreases, because the sum of $\lambda_L$ and of the electrical length $\lambda_T$ of the transmission line should be approximately equal to $\lambda_o/4$. Thus, in order to effect a significant saving in the space occupied by the transmission line T, the value of N will be substantial relative to 1, i.e. typically greater than 0.1 and, preferably, on the order of 0.5 or greater. However, the Q of the choke tends to increase as the length l is increased.

Figure 2:
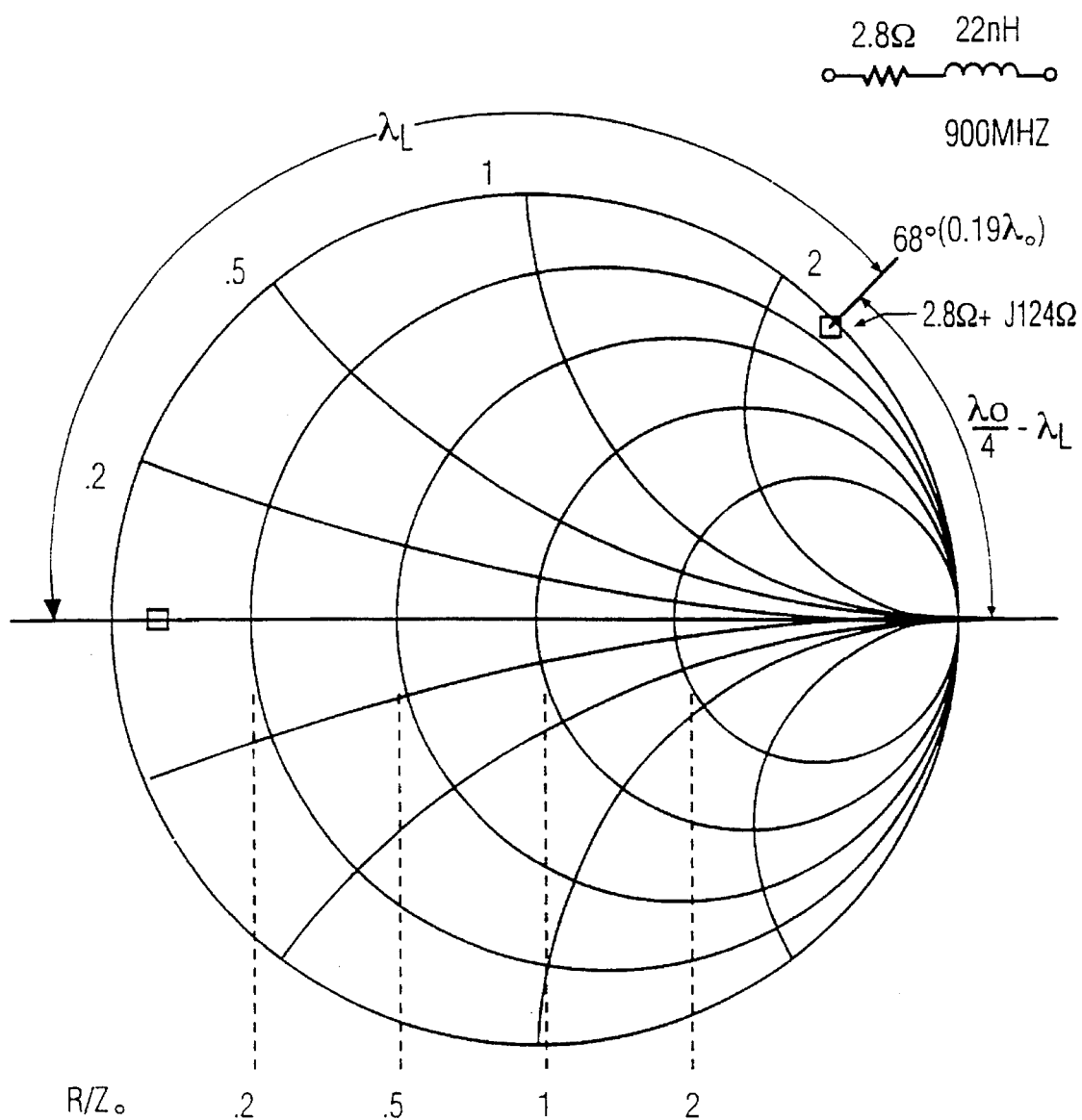
FIG. 2 is a diagram showing the impedances, phase shifts and wavelengths of components of an exemplary embodiment of a choke constructed in accordance with the invention.

In one embodiment of the microwave circuit, constructed for use in the transmitter section of a portable cellular phone, the center frequency $f_o$ was 900 MHz and the operating frequency band extended from about 890 to 915 MHz. The selected microwave amplifier A had input and output impedances of 50 Ohms and, thus, each of the transmission lines $T_{IN}$ and $T_{OUT}$ was dimensioned to have a characteristic impedance $Z_o$ equal to 50 Ohms. The capacitor C had a capacitance of 0.01 µf. The inductor L had a resistance $R_L$ of 2.8 Ohms, an inductance of 22 nH, and a Q of 45 at $f_o$. The reactance $X_L$ of the inductor at $f_o$ was $2\pi(900\times10^6)(22\times10^{-9})$=124 Ohms. The resistance $R_L$ and the reactance $X_L$ of the inductor, normalized to $Z_o$=50 Ohms, are plotted on the impedance/wavelength diagram of FIG. 2. The diagram shows that the reactance of the inductor produces a phase shift $\Phi_L$ approximately equal to 68°, which is equivalent to a transmission line electrical length of $\lambda_L$=0.19$\lambda_o$. The diagram also shows that, for a transmission line T which is dimensioned to have the characteristic impedance $Z_o$=50 Ohms, the electrical length of the line should be approximately equal to $\lambda_T=\lambda_o/4-\lambda_L$=0.06$\lambda_o$ in order to maximize the impedance of the choke at $f_o$.

The effective inductance of the combined inductive and transmission-line components is approximately fifty times as large as the inductance of the inductor L alone.

Various alternatives to the disclosed embodiment are possible. For example, either or both of the capacitive and lumped elements may be located off of the substrate. As another alternative, the circuit to which the choke is connected need not be an amplifier. Also, this circuit, the transmission line T, and at least part of the inductance of the inductor L may be included on a common chip which is disposed on the substrate. This inductance may be formed in part by, for example, the parasitic inductance of conductors on the common chip.

I claim:

1. A microwave choke which is adapted for connection to a circuit which, at an operating frequency of $f_o$, has a characteristic impedance $Z_o$ with a predetermined magnitude, said choke comprising, electrically connected in series:

a. a lumped-element capacitor having a reactance $X_C$ which, at $f_o$, is much smaller than the magnitude of the characteristic impedance $Z_o$;

b. a lumped-element inductor having a resistance $R_L$ which is much smaller than the magnitude of the characteristic impedance $Z_o$ and having a reactance $X_L$ which, at $f_o$, is much larger than the resistance $R_L$ and produces a phase shift $\Phi_L$ which is equivalent to an electrical length of $\lambda_L=N(\lambda_o/4)$, where N is less than 1 and where $\lambda_o$ is the wavelength of signals propagating at $f_o$; and c. a transmission line which, at $f_o$, has an electrical length substantially equal to $\lambda_o/4-\lambda_L$ and has a characteristic impedance with a magnitude that is not substantially different from the magnitude of $Z_o$.

2. A microwave choke disposed on a dielectric substrate supporting a conductive layer defining a ground plane, said choke being adapted for connection to a circuit which, at an operating frequency of $f_o$, has a characteristic impedance $Z_o$ with a predetermined magnitude, said choke comprising, electrically connected in series:

a. a lumped-element capacitor having a reactance $X_C$ which, at $f_o$, is much smaller than the magnitude of the characteristic impedance $Z_o$;

b. a lumped-element inductor having a resistance $R_L$ which is much smaller than the magnitude of the characteristic impedance $Z_o$ and having a reactance $X_L$ which, at $f_o$, is much larger than the resistance $R_L$ and produces a phase shift $\Phi_L$ which is equivalent to an electrical length of $\lambda_L=N(\lambda_o/4)$, where N is less than 1 and where $\lambda_o$ is the wavelength of signals propagating at $f_o$; and c. a transmission line which, at $f_o$, has an electrical length substantially equal to $\lambda_o/4 - \lambda_L$ and has a characteristic impedance with a magnitude that is not substantially different from the magnitude of $Z_o$.

3. A microwave choke as in claim 1 or 2 including a first node for electrically connecting a first terminal of the capacitor to a source of DC power, a second node for electrically connecting a second terminal of the capacitor to a reference potential, and a third node for electrically connecting an end of the choke remote from the capacitor to a power-supply node of the circuit.

4. A microwave choke as in claim 1 or 2 where the transmission line comprises a microstrip transmission line.

5. A microwave choke as in claim 1 or 2 where N is greater than 0.1.

6. A microwave choke as in claim 5 where $N \geq 0.5$.

7. A microwave choke as in claim 2 where the circuit is also disposed on the substrate.

8. A microwave circuit comprising a choke and a second circuit having a power-supply node, said second circuit, at an operating frequency of $f_o$, having a characteristic impedance $Z_o$ with a predetermined magnitude, said choke comprising:

a. a first node for electrical connection to a source of DC power;

b. a second node for electrical connection to a reference potential;

c. a third node for electrical connection to the power-supply node of the second circuit;

d. a lumped-element capacitor having a first terminal electrically connected to the first node, having a second terminal electrically connected to the second node, and having a reactance $X_C$ which, at $f_o$, is much smaller than the magnitude of the characteristic impedance $Z_o$;

e. a lumped-element inductor and a transmission line which are electrically connected in series between the first node and the third node;

said lumped-element inductor having a resistance $R_L$ which is much smaller than the magnitude of the characteristic impedance $Z_o$ and having a reactance $X_L$ which, at $f_o$, is much larger than the resistance $R_L$ and produces a phase shift $\Phi_L$ which is equivalent to a transmission line electrical length of $\lambda_L = N(\lambda_o/4)$, where N is less than 1 and where $\lambda_o$ is the wavelength of signals propagating at $f_o$;

said transmission line, at $f_o$, having an electrical length substantially equal to $\lambda_o/4 - \lambda_L$ and having a characteristic impedance with a magnitude that is not substantially different from the magnitude of $Z_o$.

* * * * *